(12) United States Patent
Chen et al.

(10) Patent No.: US 9,183,971 B1
(45) Date of Patent: Nov. 10, 2015

(54) LAYER BY LAYER REMOVAL OF GRAPHENE LAYERS

(71) Applicant: NATIONAL TSING HUA UNIVERSITY, Hsinchu (TW)

(72) Inventors: Wan-Chen Chen, Hsinchu (TW); Wei-Jen Hsu, Hsinchu (TW); Po-Yuan Teng, Hsinchu (TW); Po-Wen Chiu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/263,310

(22) Filed: Apr. 28, 2014

(51) Int. Cl.
*H01B 13/00* (2006.01)
*H01B 13/34* (2006.01)
*H01B 1/04* (2006.01)

(52) U.S. Cl.
CPC ............... *H01B 13/348* (2013.01); *H01B 1/04* (2013.01); *H01B 13/0016* (2013.01)

(58) Field of Classification Search
USPC .................. 216/13, 37; 257/29; 438/535; 204/157.41
See application file for complete search history.

(56) References Cited

U.S. PATENT DOCUMENTS

| 8,216,541 | B2 * | 7/2012 | Jang et al. | 423/448 |
| 8,395,774 | B2 * | 3/2013 | Afzali et al. | 356/432 |
| 8,753,540 | B2 * | 6/2014 | Oh et al. | 252/378 R |
| 2012/0068161 | A1 * | 3/2012 | Lee et al. | 257/29 |
| 2013/0183625 | A1 * | 7/2013 | Sung et al. | 430/323 |

* cited by examiner

*Primary Examiner* — Binh X Tran
*Assistant Examiner* — Maki Angadi
(74) *Attorney, Agent, or Firm* — Li & Cai Intellectual Property (USA) Office

(57) ABSTRACT

A method for controllable layer-by-layer removal of graphene layers is provided. The method includes the steps of: disposing a single-layer or multi-layer graphene on a heat source, arranging graphene layer or layers in a sealed chamber filled with ozone gas, and removing a targeted area of graphene with a laser. The method provides low-temperature removal of graphene layer-by-layer. The heat source, laser, and the highly oxidizing ozone gas selectively control the removal of graphene layers.

12 Claims, 7 Drawing Sheets

LAYER BY LAYER REMOVAL OF GRAPHENE LAYERS

BACKGROUND OF THE INVENTION

1. Field of the Invention

The instant disclosure relates to a method for removal of graphene layers; in particular, to a method for low-temperature and controllable layer-by-layer removal of graphene layers according to a pre-determined pattern.

2. Description of Related Art

Graphene, a single atomic thin material comprised of honeycomb carbon lattice, has attracted tremendous attention due to its exotic physical and mechanical properties compared with other known materials. Graphene possesses highest electrical conductivity and carrier mobility (>10,000 $cm^2/Vs$) as a result of its Dirac energy spectrum at low energy. It demonstrates excellent optical transparency, and it also exhibits current density and thermal conductivity about 10 times higher than those of copper. The Young's modules of graphene is found to be 500 times greater than steel yet flexible. With the vast amount of excellent properties, graphene is an ideal candidate for transparent conducting electrodes required for applications such as touch screens, liquid crystal displays, organic photovoltaic cells, and organic light-emitting diodes, as well as the particularly popular organic light-emitting diodes (OLEDs).

Vast research in the field of graphene and graphene preparation has been done to pattern graphene. In an effort to further improve graphene removal processes, oxidation of graphene has been widely applied. Exposure of graphene layers in oxygen plasma is a typical method to remove or pattern graphene. Yet, the reaction is non-selective and hard to be controlled. Ozone is another reactive agent of choice for graphene oxidation. Ozone gas can be easily generated by ultraviolet excitation of molecular oxygen and used prevalently for disinfection and purification processes in which nitrogen, sulphur and carbon containing compounds are oxidized. In the field of graphene technology, ozone can be used to react with unsaturated carbon double bonds via a process known as ozonolysis. Oxidation process based on ozone generates only gaseous waste products, $O_2$, $CO$, and $CO_2$, which simplifies experimental procedures and waste treatment processes. The process can be conducted in vivo sealed chamber thus avoiding issues with transferring and exposure to the environment. Conventional research incorporates ozone treated graphene with post treatment of optical lithography and $O_2$ plasma etching for the removal of graphene. However, analysis of ozone treated or optical lithography post-treated graphene shows the lack of selectivity in the specific number of graphene layers to be removed. Rather, either all the layers or portions of the layers are removed. Another conventional technique uses laser irradiation. To that end, high power lasers or femtosecond lasers are required. However, analysis of the laser irradiated graphene layers shows that all the layers tend to be completely removed due to overpowering laser which induces high temperature (>600° C.) at the targeted graphene areas. Lasers, such as high power-laser or high-energy-density laser (>$8 \times 10^{-4}$ $mW/nm^2$) or femtosecond laser (>80 MHz), heats the graphene up to 600° C. or higher. However, the aforementioned lasers still cannot selectively remove the specific amount of graphene layers. The three aforementioned high power lasers also tend to damage the substrate thereunder. Thus, the laser irradiation method lacks efficiency, accuracy and selectivity in the specific number of graphene layers to be removed.

To address the above issues, the inventor strives via associated experience and research to present the instant disclosure, which can effectively improve the limitation described above.

SUMMARY OF THE INVENTION

In order to achieve the aforementioned objectives, according to an embodiment of the instant disclosure, a method for low-temperature and controllable layer-by-layer removal of one or more graphene layers according to a pre-determined pattern by laser irradiation is provided.

In an embodiment of the instant disclosure, the method for layer-by-layer removal of one or more graphene layers according to a pre-determined pattern by laser irradiation includes the steps of providing at least one graphene layer with a highly graphene-oxidizing agent in a hermetic environment. Moreover, a heating source for heating at least one graphene layer is provided. A power adjustable laser for defining a pre-determined pattern on the graphene layer is provided. A feedback loop is established so as to precisely control the number of graphene layers removed by the method described herein.

In another embodiment of the instant disclosure, the method for layer-by-layer removal of one or more graphene layers according to a pre-determined pattern by laser irradiation further includes the steps of determining a number of graphene layers remained after portions of the graphene layer removed. Moreover, a number of graphene layers removed is in situ determined by providing a difference of backward light absorbance, Raman spectra, or electrical resistivity between the number of graphene layers remained and the pristine number of graphene layers. Then, the number of graphene layers removed is compared to the targeted number of graphene layers to be removed. Successively, a controller operatively connected to the laser is programmed, such that the laser power is adjustable with respect to the difference between the number of graphene layers removed and the targeted number of graphene layers to be removed.

In another embodiment of the instant disclosure, in which in the step of determining the number of graphene layers remained after portions of the graphene layer removed, the number of graphene layers remained is determined by measuring backward light absorbance, Raman spectra or electrical resistivity corresponding to the number of graphene layers remained and comparing the measured light absorbance, Raman spectra, or electrical resistivity value to a pre-determined light absorbance, Raman spectra, or electrical resistivity value corresponding to a pre-determined number of graphene layers.

In another embodiment of the instant disclosure, the method can include the step of displacing an adjustable structure for retaining the laser thereon and an adjustable stage for retaining the at least one graphene layer thereon according to the pre-determined pattern. The adjustable structure and the adjustable stage are electrically connected to and motorized through a controller. Furthermore, a lens can be interposed between the laser and the at least one graphene layer for adjusting the focus of the laser.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

The aforementioned illustrations and detailed descriptions are exemplarities for the purpose of further explaining the scope of the instant disclosure. Other objectives and advantages related to the instant disclosure will be illustrated in the subsequent descriptions and appended drawings.

The graphene in the instant disclosure is a 2-dimensional, crystalline allotrope of carbon in which carbon atoms are densely packed in a $sp^2$-bonded hexagonal pattern. Graphene is a single-layer of graphite and denoted as a graphene layer from hereon in. Graphene can be grown or transferred onto a substrate, for example on a glass or silicon substrate, on which a determined pattern is created in accordance with the embodiment of the instant disclosure. Thus, patterns of various sizes and shapes can be efficiently applied to a carbonaceous electronic device or the like by designing a circuit thereon. The graphene layers grown or transferred on the substrate may have more than one layer, depending on its functionality in applications.

Figure 1:
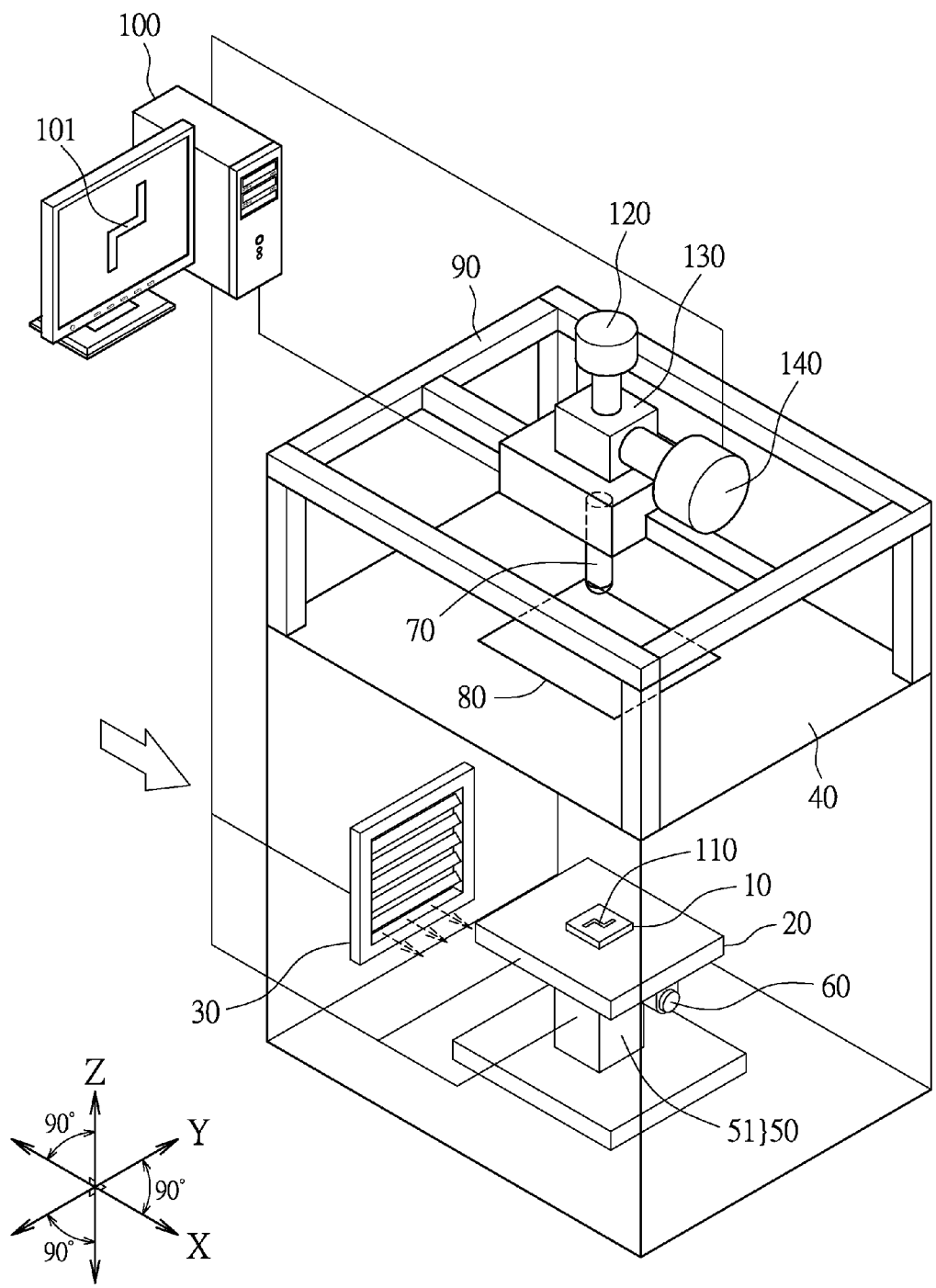
FIG. 1 is a schematic diagram illustrating an exemplary setup for a method of layer-by-layer removal of graphene layers in accordance with an embodiment of the instant disclosure.

FIG. 1 is a schematic diagram illustrating an exemplary setup for a method of layer-by-layer removal of graphene layers in accordance with an embodiment of the instant disclosure. As shown in FIG. 1, a graphene layers 10 is formed on a substrate 20. The substrate is not restricted in the implementation of this invention and can be for example glass, quartz, sapphire, silicon wafer, or soft substrates such as PET and PEN. A highly graphene-oxidizing agent such as ozone gas, chlorine gas, fluorine gas, sulfuric acid, sodium nitrate, or potassium permanganate is provided to effectively oxidize graphene. The agent in the instant embodiment is ozone gas but not limited herein. Other graphene-oxidizing agent providing similarly high efficiency in oxidizing graphene can also be applied. The ozone gas (shown as small arrows) is consistently supplied at a weight percent (wt %) of 0.01 to 20 and is generated by converting a stream of oxygen ($O_2$, shown as a big arrow) via an ozone generator 30. The preferred concentration of ozone gas is 0.05 wt %. The graphene layers 10, substrate 20, and the ozone generator 30 are confined in a hermetic chamber 40 (ex. in vivo sealed chamber). The ozone generator 30 can also be set up outside the hermetic chamber 40.

Figure 5:
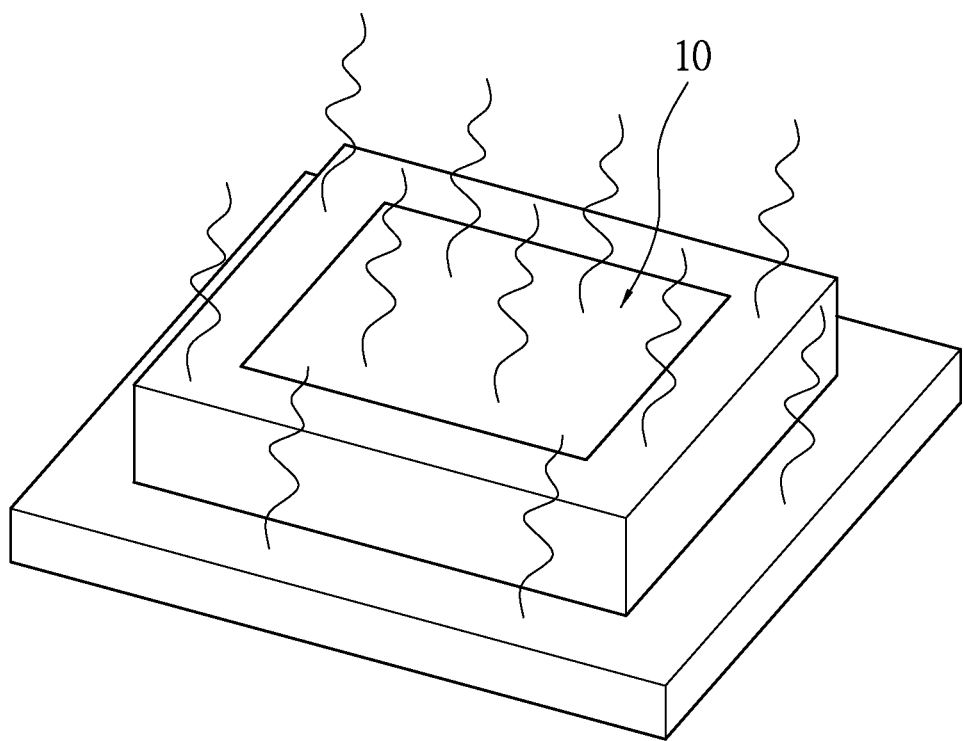
FIG. 5 is a schematic diagram illustrating a hot plate heating graphene layers in accordance with the embodiment of the instant disclosure.
Figure 6:
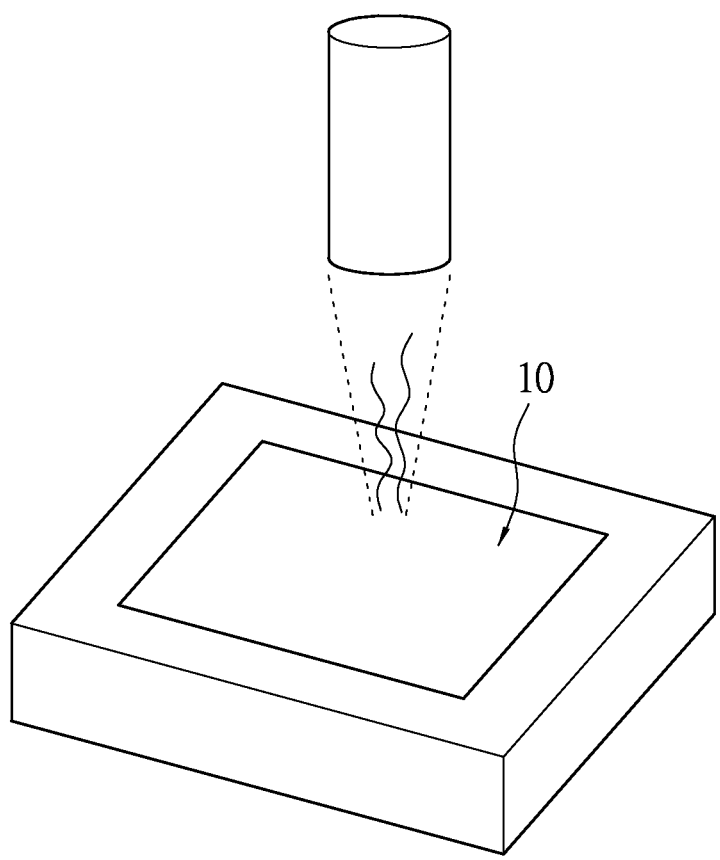
FIG. 6 is a schematic diagram illustrating an infrared illumination heating graphene layers in accordance with the embodiment of the instant disclosure.
Figure 7:
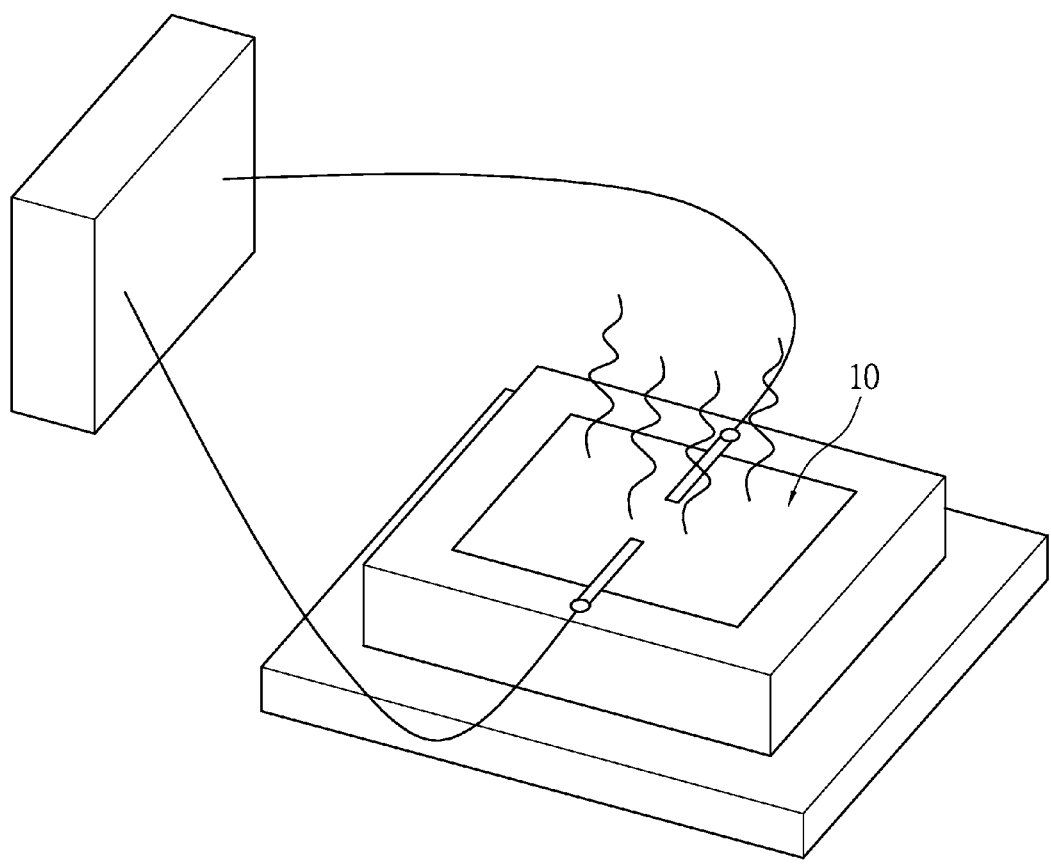
FIG. 7 is a schematic diagram illustrating an electric current heating graphene layers in accordance with the embodiment of the instant disclosure.

A heat source 50 and a thermometer 51 are also included as part of the setup to respectively provide a source of thermal energy to the graphene layers 10 and measure instantaneous temperature of the heat source 50. The heat source 50 in the instant embodiment is a hot plate as shown in FIG. 5, while the thermometer is a K type thermometer, but the types of heat source and thermometer are not limited to the examples provided herein. FIG. 6 is a diagram illustrating an infrared illumination heating graphene layers in accordance with the embodiment of the instant disclosure. FIG. 7 is a diagram illustrating an electric current heating graphene layers in accordance with the embodiment of the instant disclosure.

An adjustable stage 60 is provided to support and displace the substrate 20, where the graphene layers 10 is disposed, along the x-, y-, and z-axis directions as shown in FIG. 1. A manual adjustable stage 60 with adjustable knobs (not labeled) correspondingly displaces the substrate 20 and the graphene layers 10 thereon along the x-, y-, and z-axis. The adjustable stage 60 can also be provided with a motorized mechanism to allow displacements according to a pre-determined pattern 101. Moreover, the setup also includes a laser 120 (such as Model name: OSRAM 1.4 W 5.6 mm 450 nm blue laser diode PL TB450) and a lens 80. The laser 120 is arranged to aim at a target spot on the graphene layers 10, whereas the lens 80 is installed on the hermetic chamber 40 and configured in the line of irradiation of the laser 120 for adjusting the focus of the laser 120. A focusing system 70 is electrically connected to the lens 80 to adjust the focusing of the lens 80.

As shown in FIG. 1, an adjustable structure 90 is further included in the setup to fix the laser 120 thereon and provide translational displacements of the laser 120 along the x-, y-, and z-axis directions with respect to the adjustable stage 60. The adjustable structure 90 as shown in FIG. 1 is a structural frame (not labeled) with a motorized mechanism (not labeled) and corresponding rails or tracks (not labeled) to provide the x-, y-, and z-axis translational displacements with respect to the adjustable stage 60.

A controller 100 is also included in the setup to provide programming of the pre-determined pattern 101. The controller 100 is electrically connected to the ozone generator 30, the heat source 50, the thermometer 51, the laser 120, the focusing system 70, the lens 80, the adjustable stage 60, and the adjustable structure 90 to correspondingly provide control over the flow rate of ozone generation, temperature of the heat source, laser power, laser beam focusing, and motorized displacements of the laser 120 and the stage 60.

Figure 2:
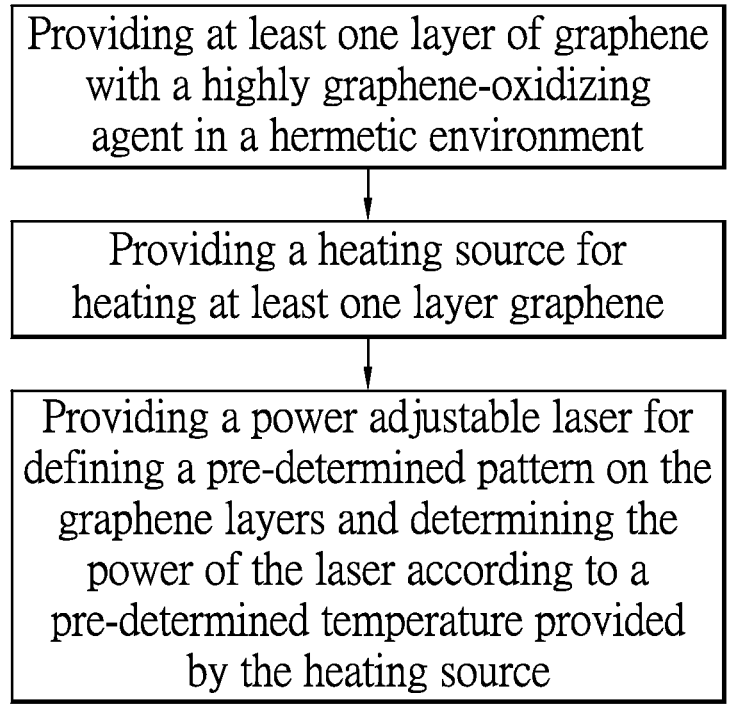
FIG. 2 is a block diagram illustrating the process flow for the layer-by-layer removal of graphene layers in accordance with the embodiment of the instant disclosure.

FIG. 2 is a block diagram illustrating the process flow for the layer-by-layer removal of graphene layers in accordance with the embodiment of the instant disclosure. As shown in FIG. 2, the method for layer-by-layer removal of graphene layers includes providing at least one layer of graphene with a highly graphene-oxidizing agent, such as ozone gas, chlorine gas, fluorine gas, concentrated sulfuric acid, sodium nitrate, or a mixture of potassium permanganate, in a hermetic chamber. The graphene layers is sealed off in the hermetic chamber and isolated from the surrounding environment to prevent ozone leakage. The ozone generator is used to supply ozone gas therein. The heating source, such as a hot plate or infrared illumination, provides heating for at least one graphene layer. The graphene layers is heated to a temperature between 20 and 300° C., depending on the substrate used. Successively, a laser is provided with adjustable power for defining a pre-determined pattern on the graphene layers. The laser is power-adjustable and is correspondingly tuned to a preferred operational voltage such as 5-6 volts for the laser mentioned, thus providing sufficient energy to raise the local temperature of the graphene layers to a threshold temperature and to remove or pattern graphene. The pre-determined pattern can be applied on one or more layers. The preferably operation temperature ranges from 30 to 300° C., with the most preferable temperature at 150° C.

Typically, conventional laser irradiation techniques provide such strong power that the local temperature at the targeted graphene can be higher than 600° C., making the conventional removal technique hard to be controlled, as opposed to the layer-by-layer removal of graphene layers method in accordance with the instant disclosure in which the temperature ranges from 30 to 300° C.

Figure 3:
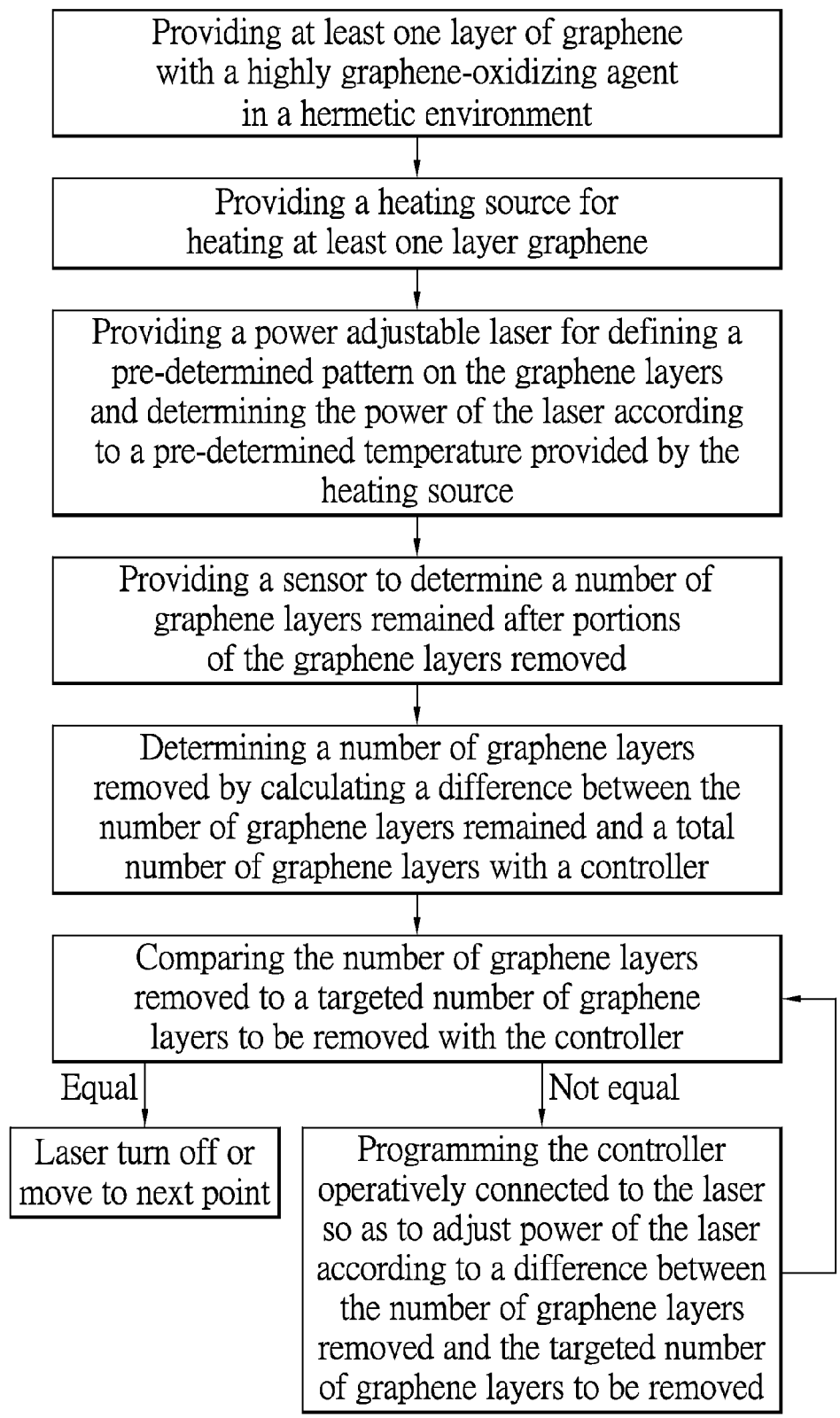
FIG. 3 is a block diagram illustrating further details of the process flow for the layer-by-layer removal of graphene layers method in accordance with another embodiment of the instant disclosure.

In another embodiment as shown in FIG. 3 in conjunction with reference to FIG. 1, the instant disclosure can further include the determination of the number of graphene layers removed (denoted as LR) after certain portions, less than or more than a complete graphene layer deep or a fraction of graphene layer deep, of the graphene layers are removed by the laser according to the pre-determined pattern 101. Specifically, after the laser partially removes portions of graphene layers according to the pattern, a number of graphene layers remained or actual (denoted as LA) is determined. The number of graphene layers actual LA is further disclosed in details hereafter. The number of layers actual LA is then compared to a total number of graphene layers LT, in which the difference therebetween is the number of graphene layers removed LR. The number of graphene layers removed LR is then compared to a targeted number of graphene layers (denoted as LRT) or targeted layers to be removed. Moreover, in conjunction with the setup of the instant disclosure, the controller 100 operatively connected to the laser 120 as aforementioned is programmed with feedback loop, such that power adjustment of the laser 120 can be made according to the difference between the number of layers removed LR and the targeted layers to be removed LRT. For example: if the number of layers removed LR is less than the targeted layers to be removed LRT, the difference between the number of layers removed LR and the targeted layers to be removed LRT is sent to the feedback loop, such that the laser power is raised to further remove one layer of graphene at a time from the graphene layers LA until the number of removed layers LR equals to the targeted layers to be removed LRT, then the feedback loop will deactivate the laser from further graphene removal. Alternatively, if the number of layers removed LR is equal to the number of targeted layers to be removed LRT, the difference between the number of layers removed LR and the number of targeted layers to be removed LRT is likewise sent to the feedback loop, such that the laser power is immediately turned off to prevent further graphene removal such that only the selected number of layer or layers according to the pre-determined pattern 101 is removed.

Figure 4:
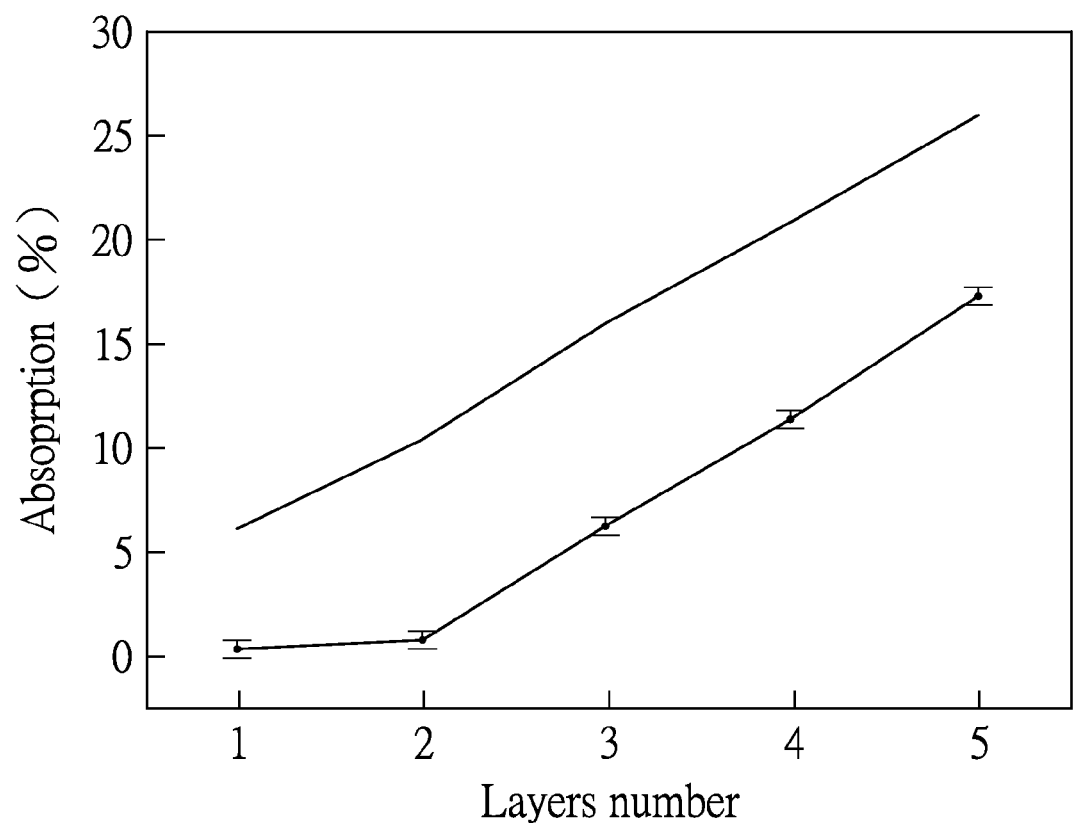
FIG. 4 illustrates both the light absorbance (%) of pristine graphene layers and the light absorbance with two graphene layers removed by the layer-by-layer removal of graphene method in accordance with the embodiment of the instant disclosure.

The number of graphene layers remained or actual LA as aforementioned is determined by measuring the backward light absorbance (%) actual (denoted as AA) which corresponds to the number of layers remained or actual LA. For example: after certain portions, less than or more than a complete graphene layer deep or a fraction of graphene layer deep, of the graphene layers are removed by the laser 120, light absorbance of the remaining or actual graphene layers AA is measured. The absorbance actual AA is then compared to a pre-determined absorbance (denoted as AP) at which a pre-determined number of graphene layers (denoted as LP) corresponds. By comparing the two absorbance spectra, and applying the correlation between the pre-determined absorbance AP and the pre-determined number of graphene layers LP, the number of graphene layers remained or actual LA is determined. FIG. 4 illustrates both the backward light absorbance (%) of pristine graphene layers and the backward light absorbance with two graphene layers removed by the layer-by-layer removal of graphene layers in accordance with the embodiment of the instant disclosure. As shown in FIG. 4, 3 layers of pristine graphene have an overall absorption of 15 to 16% ("pristine" line). After two layers are removed, the absorption is reduced to 5 to 7% ("after remove two layers" line). In other words, one layer remains. Another embodiment demonstrates that 5 layers of pristine graphene layers have an overall absorption between 25 to 26% ("pristine" line). After two layers are removed, the absorption is reduced to 16 to 17% ("after remove two layers" line). In other words, three layers remain. In general, each graphene layer has an absorption of about 5%.

Besides light absorbance spectra, Raman spectra, and electrical resistivity can also be a basis or unit of measurement for comparison between the targeted number of graphene layers to be removed LRT and the number of graphene layers removed LR to remove the preferred number of graphene layers. In order to measure electrical resistivity across the graphene layers, a pair of electrodes are arranged on opposite sides of the graphene layers while a current is provide therebetween. Due to the excellent electrical conductivity of graphene, changes in conductivity as well as resistivity are readily observed with the proper conductivity/resistivity measuring units. As conductivity is directly related to the amount of graphene, if a higher conductivity is measured, a larger number of graphene layers is present. In other words, a specific number of graphene layers can be correlated to a specific electrical conductivity value.

Please refer to FIGS. 1-4 as an embodiment of the method in conjunction with the setup as aforementioned. 3 graphene layers are formed on a silica substrate and the targeted number of graphene layers to be removed is set as 1. A pre-determined pattern, a complex pattern such as a circuit, is programmed into a controller as shown in FIG. 1. The hot plate uniformly heats up the layers to the preferred temperature of 70° C. The ozone generator then generates preferably a concentration of 0.5 wt. % ozone gas. Successively, to remove graphene according to the complex pattern, the laser irradiates a light beam on one graphene layer at a preferable voltage of 5-6 volts, such that the irradiated target graphene locally reaches a preferred temperature of about 100 to 120° C., and oxidizes with ozone in order to remove the graphene layer. While the laser is in the process of patterning the graphene layers, meaning only portions (less than or more than a complete graphene layer deep or a fraction of graphene layer deep) of the layers are removed, light absorbance spectra are measured (frequent measurements can be taken as preferred for higher accuracy of layers determination) to determine the number of layers already removed by the laser. To measure a light absorbance spectra while removing graphene, an optical sensor or a spectrometer 140 is arranged proximate to the laser. When the laser irradiates a laser beam to the graphene layers, portions of the laser beam is being absorbed by the graphene, and the remaining portions of the laser beam reflect towards the laser. By arranging a beam splitter 130 in the route of the reflected laser beam and splitting portions of the reflected laser beam to the spectrometer 140, a light absorbance spectrum is determined corresponding to the amount of laser beam being absorbed by the graphene layer. The light absorbance spectrum measured is then compared to a pre-determined light absorbance spectrum, at which a pre-determined number of graphene layers is corresponding to. By comparing the two light absorbance spectra, and applying the correlation between the pre-determined light absorbance and the pre-determined number of graphene layers, the number of graphene layers actually remain is determined.

In summary, by applying proportional power of laser and heat source along with ozone treatment to graphene as in the method according to the embodiments of the instant disclosure, sufficient energy is provided to remove one or more graphene layer(s) according to the pre-determined pattern without damaging the rest of the underlayers, or the substrate thereunder, thus providing layer-by-layer removal of graphene layers. As opposed to the conventional laser technology where the desired and the undesired graphene layers, as well as the substrate thereunder, run the risk of being burnt or damaged by laser irradiation. In the method in accordance with the instant disclosure, the laser power is adjustable with respect to the power of the heat source in an inverse manner. If the power of laser is reduced for example, the power of the heat source is correspondingly increased in order to cooperatively provide sufficient energy to remove layer-by-layer one or more graphene layer(s) with respect to the pre-determined pattern without damaging the layer(s) or the substrate thereunder not intended for the removal process. Meanwhile, the graphene layers intended to be removed according to the pre-determined are done so at a temperature between 100 to 200° C. The instant method provides selective removal according to a pattern on a large area of graphene, provides improvements upon processing time, process temperature, and also significantly reduces manufacturing equipment costs while maintaining the quality of the unprocessed regions of graphene.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A method for controllable layer-by-layer removal of graphene layers, comprising the steps of:
   providing a plurality of graphene layers;
   providing a highly graphene-oxidizing agent in a hermetic environment;
   providing a heating source for heating the plurality of graphene layers; and
   providing a power adjustable laser for defining a pre-determined pattern on the plurality graphene layers,
   wherein defining the pre-determined pattern on the plurality of graphene layers includes steps of removing the plurality of graphene layers layer-by-layer by the power adjustable laser according to the pre-determined pattern, and the steps include:
   determining a targeted number of graphene layers to be removed according to the pre-determined pattern;
   partially removing portions of the plurality of graphene layers according to the pre-determined pattern by the power adjustable laser;
   then determining a number of graphene layers remained;
   obtaining a number of graphene layers removed by calculating the difference between a total number of graphene layers and the number of graphene layers remained through a feedback loop controller;
   calculating the difference between the number of graphene layers removed and the targeted number of graphene layers to be removed to determine a number of graphene layers to be further removed through the feedback loop controller;
   adjusting the power of the power adjustable laser according to the number of graphene layers to be further removed through the feedback loop controller; and
   repeating the steps until all of the targeted number of graphene layers are removed.

2. The method as recited in claim 1, further comprising the steps of:
   providing a sensor to determine the number of graphene layers remained after portions of the graphene layers removed;
   determining the number of graphene layers removed by calculating the difference between the number of graphene layers remained and the total number of pristine graphene layers through a feedback loop controller;
   comparing the number of graphene layers removed to the targeted number of graphene layers to be removed through a feedback loop controller;
   programming the feedback loop controller operatively connected to the laser so as to adjust the laser power according to a difference between the number of graphene layers removed and the targeted number of graphene layers to be removed.

3. The method as recited in claim 2, wherein the number of graphene layers remained after portions of the graphene layers removed is determined by measuring light absorbance spectra, Raman spectra, or electrical resistance corresponding to the number of graphene layers remained with the sensor and comparing the measured light absorbance spectra, Raman spectra, or electrical resistance to a pre-determined light absorbance spectra, Raman spectra, or electrical resistance value corresponding to a pre-determined number of graphene layers through the feedback controller.

4. The method as recited in claim 3, wherein the sensor is a spectrometer or a resistivity measurement unit.

5. The method as recited in claim 1, further comprising the steps of:
   displacing selectively an adjustable structure for retaining the laser thereon and an adjustable stage for retaining the at least one graphene layer thereon according to the pre-determined pattern.

6. The method as recited in claim 5, the adjustable structure and the adjustable stage are displaced by motorization and operatively connected to a controller.

7. The method as recited in claim 1, further comprising the steps of:
   arranging a lens interposed between the laser and the at least one graphene layer for adjusting the focus of the laser.

8. The method as recited in claim 1, wherein the highly graphene-oxidizing agent is ozone gas, chlorine gas, fluorine gas, sulfuric acid, sodium nitrate, or potassium permanganate.

9. The method as recited in claim 1, wherein the intensity of the laser beam is adjustable.

10. The method as recited in claim 1, wherein the heating source is a hot plate, an infrared illumination source, or an electrical current source for providing the pre-determined temperature.

11. The method as recited in claim 1, wherein the graphene layers being heated by the heating source at a temperature ranges from 20 to 300° C.

12. The method as recited in claim 1, wherein the highly graphene-oxidizing agent is ozone gas, the ozone gas is in a concentration range of 0.01 to 20 weight percent.

\* \* \* \* \*